United States Patent [19]

Murayama et al.

[11] Patent Number: 5,004,935
[45] Date of Patent: Apr. 2, 1991

[54] SAMPLE AND HOLD CIRCUIT

[75] Inventors: Akihiro Murayama, Yokohama; Takeshi Koyama, Tokyo, both of Japan

[73] Assignee: Kabushiki Kaisha Toshiba, Kawasaki, Japan

[21] Appl. No.: 500,091

[22] Filed: Mar. 21, 1990

Related U.S. Application Data

[63] Continuation of Ser. No. 402,455, Sep. 5, 1989, abandoned, which is a continuation of Ser. No. 186,305, Apr. 26, 1988, abandoned.

[30] Foreign Application Priority Data

Apr. 28, 1987 [JP] Japan .................. 62-103245

[51] Int. Cl.$^5$ .............................................. G11C 27/02
[52] U.S. Cl. ...................................... 307/353; 307/359
[58] Field of Search ................. 307/353, 359; 328/151

[56] References Cited

U.S. PATENT DOCUMENTS

| | | | |
|---|---|---|---|
| 3,694,668 | 9/1972 | Foerster | 307/359 |
| 4,321,488 | 3/1982 | Srivastava | 307/353 |
| 4,328,434 | 5/1982 | Geller | 307/359 |
| 4,389,579 | 6/1983 | Stein | 307/353 |

FOREIGN PATENT DOCUMENTS 0109353  8/1979  Japan .................. 307/353

OTHER PUBLICATIONS

T. Algra et al., "Precision Sample-and Hold Circuit Drives Output with a Current Source", Electronic Design 1, Jan. 4, 1978, p. 154.

*Analysis and Design of Analog Integrated Circuits*, Chap. 4, Sec 3, "Current Sources as Active Loads"; Paul R. Gray et al.; 1977.

Primary Examiner—John Zazworsky
Attorney, Agent, or Firm—Oblon, Spivak, McClelland, Maier & Neustadt

[57] ABSTRACT

A sample and hold circuit for sampling an input signal having a variable input voltage. The circuit includes an input circuit for supplying the input signal, a holding capacitor for storing a charge voltage in response to a charge current supplied thereto when a charge voltage stored previously therein is lower than the input voltage and for producing a discharge current when the previous stored charge voltage is higher than the input voltage, a differential circuit for comparing the voltage levels of the input voltage and the charge voltage, and generating a differential current in response thereto, a current amplifier for generating the charge current in response to the differential current when the previous stored charge voltage is lower than the input voltage and for amplifying the discharge current when the previous stored charge voltage is higher than the input voltage and a switch for selectively activating and deactivating the current amplifier.

12 Claims, 2 Drawing Sheets

SAMPLE AND HOLD CIRCUIT

This application is a continuation application of U.S. patent application Ser. No. 07/402,455 filed on Sept. 5, 1989, which was a continuation of U.S. patent application Ser. No. 07/186,305 filed on Apr. 26, 1988, both now abandoned.

FIELD OF THE INVENTION

The present invention relates generally to a sample and hold circuit, and more particularly, to a sample and hold circuit suitable for use with a pedestal level clamping circuit in television receivers.

BACKGROUND OF THE INVENTION

Conventionally, a pedestal level clamping circuit in television receivers is constituted by a sample and hold circuit. A composite video signal is obtained by a tuning circuit of the television receiver. The pedestal level of the composite video signal is restored by the sample and hold circuit.

A typical example of a conventional sample and hold circuit used in a television receiver is shown in FIG. 1. For example, the conventional sample and hold circuit as shown in FIG. 1 has been used in a Toshiba IC device, model No. TA 7777.

As shown in FIG. 1, the sample and hold circuit is comprised of an input signal source 10, a differential circuit 12, a switch 14 and a capacitor 16.

In the differential circuit 12, a pair of first and second transistors 18 and 20 are coupled with each other in a differential manner. That is, the emitters of the first and second transistors 18 and 20 are coupled with each other.

A connection node 22 between the emitters of the transistors 18 and 20 is coupled to the switch 14. The switch 14 is coupled to a power supply source 24 through a constant current source 26. Further, a control terminal 14a of the switch 14 is coupled to a sampling pulse source 28.

The base of the first transistor 18 is coupled to a grounded terminal 30 through a series circuit of the input signal source 10 and a reference voltage source 32. The collector of the first transistor 18 is coupled to the grounded terminal 30 through a diode 34.

The base of the second transistor 20 is coupled to the grounded terminal 30 through the capacitor 16. Further, the base of the second transistor 20 is coupled to an output terminal 36. The collector of the second transistor 20 is coupled to the grounded terminal 30 through a third transistor 38. Further, the collector of the second transistor 20 is coupled to the capacitor 16.

The diode 34 and the third transistor 38 are coupled to each other so that a current mirror circuit 40 is formed.

The operation of the conventional sample and hold circuit shown, as in FIG. 1, will be briefly described.

The input signal source 10 provides an input signal, e.g., a composite video signal Sv. The composite video signal Sv is supplied to the base of the first transistor 10 together with a reference voltage Vref generated from the reference voltage source 32.

The sampling pulse source 28 provides a sampling pulse SP which varies periodically between the "H" or "1" level and the "L" or "0" level. In a television receiver, a burst gate pulse can be used as the sampling pulse SP. In this case, a burst gate pulse generator provided in a television receiver also is used as the sampling pulse source 28.

The sampling pulse SP controls the switch 14 so that the operation mode of the sample and hold circuit changes between a sampling mode and a holding mode, as described later.

When the switch 14 turns ON in response to the "H" level input of the sampling pulse SP, the sample and hold circuit enters into the sampling mode. In the sampling mode, the constant current source 26 supplies a prescribed constant current Ic to the differential circuit 12. Thus, the differential circuit 12 is activated.

The first transistor 18 receives at its base the composite video signal Sv and the reference voltage Vref. Then, a collector current $I_{18}$ flows through the first transistor 18 in response to the composite video signal Sv biased by the reference voltage Vref. The current $I_{18}$ flows through the diode 34 of the current mirror circuit 40. As a result, a mirror current $I_{38}$, the same as the current $I_{18}$, is obtained in the third transistor 38 due to the current mirror operation of the current mirror circuit 40.

The second transistor 20 receives at its base a current $I_{16}$ which corresponds to a voltage $V_{16}$ charged in the capacitor 16 at that time. Then, a collector current $I_{20}$ flows through the second transistor 20 in response to the voltage $V_{16}$.

The collectors of the second and third transistors 20 and 38 are connected to the capacitor 16. Thus, a current Id, i.e., the difference between the mirror current $I_{38}$ flowing through the third transistor 38 and the collector current $I_{20}$ flowing through the second transistor 20 flows into the capacitor 16 for charging the capacitor 16. The operations of the first and second transistors 18 and 20 balance with each other when the base potential of the second transistor 20, i.e., the voltage $V_{16}$ charged to the capacitor 16, has reached the base potential of the first transistor 18. As a result, the capacitor 16 is charged to the voltage $V_{16}$ equivalent to the composite video signal Sv biased by the reference voltage Vref.

When the switch 14 turns OFF, the sample and hold circuit enters into the holding mode. In the holding mode, the differential circuit 12 is disconnected from the constant current source 26 so that the differential circuit 12 is deactivated. In the deactivated condition of the differential circuit 12, the second and third transistors 20 and 38 connected to the capacitor 16 are also cut off. As a result, the charge of the capacitor 16 at the time when the switch 14 has turned OFF is held, without being discharged.

According to the above ON and OFF operations of the switch 14, a prescribed level of the composite video signal Sv is sampled by the differential circuit 12 and then held in the capacitor 16.

The conventional sample and hold circuit, as shown in FIG. 1, has a drawback as described below.

The pedestal level of the composite video signal Sv occasionally causes a sudden change. At that time, there arises a big gap between the base potentials of the first and second transistors 18 and 20. The first or second transistor 18 or 20 flows a large collector current $I_{18}$ or $I_{20}$ therethrough in response to the big potential gap. The collector current $I_{18}$ or $I_{20}$ is supplied from the constant current source 26, as described above.

Accordingly, the constant current Ic must be relatively large so that it can provide a sufficient amount for the collector current $I_{18}$ or $I_{20}$ in response to a maximum gap between the pedestal level of the composite video signal Sv and the charge voltage $V_{16}$ applied to the bases of the first and second transistors 18 and 20, respectively.

Such a large amount of constant current Ic is supplied during the sampling mode, while the composite video signal Sv is almost stable so that such a sudden change of the pedestal level of the composite video signal Sv rarely occurs.

When $S_v$ is stable, which is in the largest percentage of time an excessive amount of the constant current Ic is wasted. In a typical example of a conventional television receiver, the constant current Ic would have a design value on the order of of hundreds to thousands of $\mu A$. However, the actual amount of the collector current Ic is only dozens of $\mu A$ or less in most of the sampling periods.

As a result, a considerable amount of current is wasted in the conventional sample and hold circuit. Accordingly, it has been desired to reduce the constant current Ic of the sample and hold circuit. In a battery driven device, such as a portable television receiver, reduction of the constant current Ic has been eagerly sought.

SUMMARY OF THE INVENTION

It is, therefore, an object of the present invention to provide a sample and hold circuit which does not waste substantial current.

Another object of the present invention is to provide a sample and hold circuit in which the constant current has a relatively low value.

A further object of the present invention is to provide a sample and hold circuit in which current consumption can be varied in response to the input signal.

In order to achieve the above object, a sample and hold circuit according to one aspect of the present invention includes an input source for supplying an input signal with a variable input voltage, a holding capacitor for storing a charge voltage in response to a charge current supplied thereto when a charge voltage stored previously therein is lower than the input voltage and for producing a discharge current when the previous stored charge voltage is higher than the input voltage, a differential circuit for comparing the voltage levels of the input voltage and the charge voltage, and generating a differential current response thereto, a current amplifier for generating the charge current in response to the differential current when the previous stored charge voltage is lower than the input voltage and for amplifying the discharge current when the previous stored charge voltage is higher than the input voltage and a switch for selectively activating and deactivating the current amplifier.

Additional objects and advantages of the present invention will be apparent to persons skilled in the art from a study of the following description and the accompanying drawings, which are hereby incorporated in and constitute a part of this specification.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
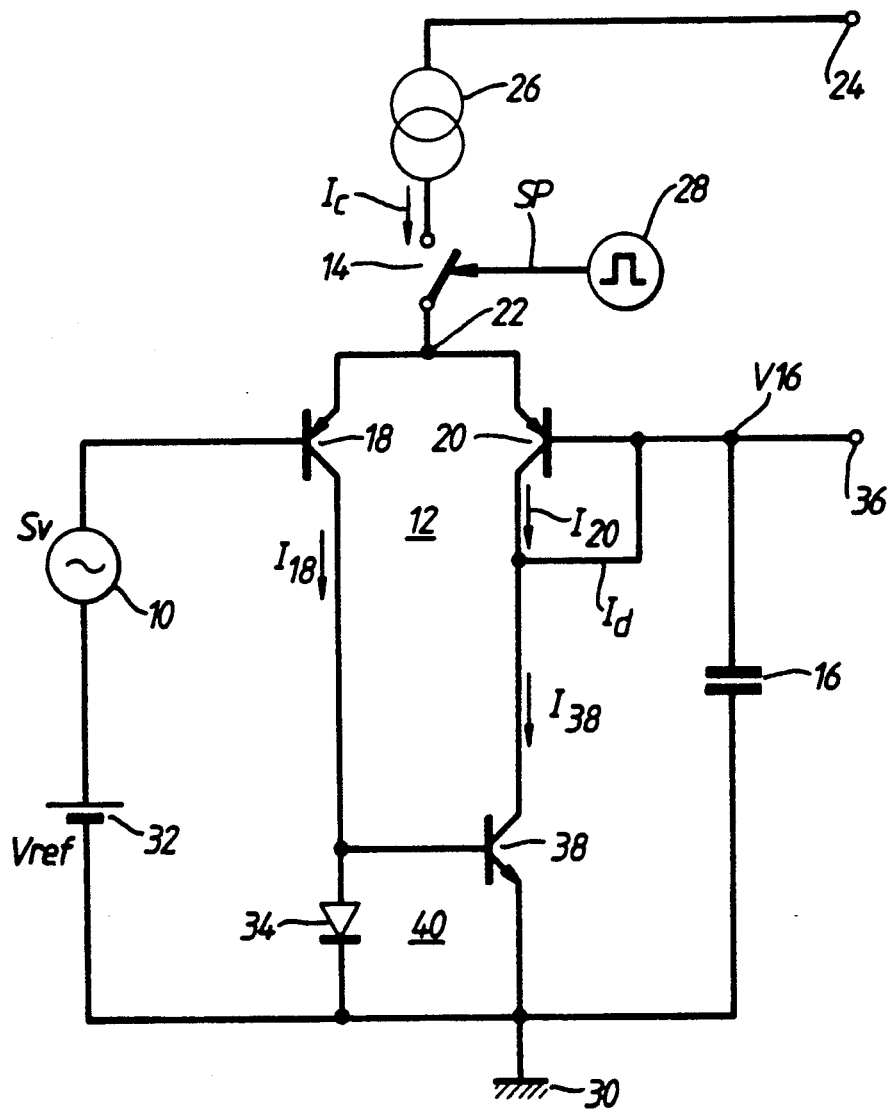
FIG. 1 is a circuit diagram showing an example of a conventional sample and hold circuit.

The present invention will be described in detail with reference to FIG. 2. In FIG. 2, reference numerals or letters used in FIG. 1 (Prior Art) will be used to designate like or equivalent elements for simplicity of explanation.

Referring now to FIG. 2, a preferred embodiment of the sample and hold circuit according to the present invention will be described in detail.

As shown in FIG. 2, the embodiment of the sample and hold circuit is comprised of an input signal source 10, a differential circuit 12, a current amplifier 100, a switch 14 and a capacitor 16.

The differential circuit 12 is comprised of a pair of first and second transistors 18 and 20. These transistors 18 and 20 are coupled to each other in a differential manner, as described before.

A connection node 22 between the emitters of the transistors 18 and 20 is coupled to a power supply source 24 through a first constant current source 26.

The base of the first transistor 18 is coupled to a grounded terminal 30 through a series circuit of the input signal source 10 and a reference voltage source 32. The collector of the first transistor 18 is coupled to a grounded terminal 30 through a first resistor 102 in the current amplifier 100, as described later.

The base of the second transistor 20 is coupled to the grounded terminal 30 through the capacitor 16. Further, the base of the second transistor 20 is coupled to an output terminal 36. The collector of the second transistor 20 is coupled to the grounded terminal 30 through a second resistor 104 in the current amplifier 100, as also described later.

The current amplifier 100 is constituted as follows. Third and fourth transistors 106 and 108 are coupled at their bases to each other. A connection node 110 between the bases is coupled to the collectors of the third and fourth transistors 106 and 108 through third and fourth resistors 112 and 114, respectively. Further, the connection node 110 is coupled to the switch 14. The switch 14 is coupled to the power supply source 24 through a second constant current source 116. A control terminal 14a of the switch 14 is coupled to a sampling pulse source 28.

The emitters of the third and fourth transistors 106 and 108 are coupled to the grounded terminal 30 through the first and second resistors 102 and 104, respectively. Thus, the first transistor 18 of the differential circuit 12 and the third transistor 106 of the current amplifier 100 are coupled to the grounded terminal 30 through the first resistor 102 in common. Also, the second transistor 20 of the differential circuit 12 and the fourth transistor 108 of the current amplifier 100 are coupled to the grounded terminal 30 through the second resistor 102 in common.

The collectors of the third and fourth transistors 106 and 108 are coupled to the bases of fifth and sixth transistors 118 and 120, respectively. The emitter of the fifth and sixth transistors 118 and 120 are coupled to the grounded terminal 30. The collectors of the fifth and sixth transistors 118 and 120 are coupled to power supply source 24 through seventh and eighth transistors 122 and 124, respectively. Further, a connection node between the collectors of the fifth and seventh transistors 118 and 122 is coupled to the capacitor 16 or the output terminal 36.

The bases of the seventh and eighth transistors 122 and 124 are coupled to each other. Further, the base of the eighth transistor 124 is coupled to the collector of the eighth transistor 124 itself through a ninth transistor 126. That is, the emitter to collector path of the ninth transistor 126 is coupled between the base of the eighth transistor 124 and the grounded terminal 30. The base of the ninth transistor 126 is coupled between the collector of the eighth transistor 122. Therefore, the seventh, eighth and ninth transistors 122, 124 and 126 constitute a current mirror circuit 38a.

The current mirror circuit 38a may be modified by directly coupling the base and the collector of the eighth transistor 124 together. In other words, the eighth transistor 124 is connected in a diode manner in the case of the modification.

The operation of the embodiment of the sample and hold circuit according to the present invention, as shown in FIG. 2, will be briefly described.

Here, the operation will be explained under following assumptions:

I. The first constant current $Ic_1$ is twice as large as the second constant current $Ic_2$ ($Ic_1 = 2 \cdot Ic_2$);
II. The resistances $R_1$ and $R_2$ of the first and second resistors 102 and 104 are the same as each other ($R_1 = R_2$);
III. The resistances $R_3$ and $R_4$ of the third and fourth resistors 112 and 114 are the same, and they are three times as large as the resistance $R_1$ or $R_2$ of the first or second resistor 102, 104 ($R_3 = R_4 = 3 \cdot R_1$ (or $3 \cdot R_2$)); and
IV. The third through sixth transistors 106, 108, 118 and 120 of the current amplifier 100 have almost the same characteristics as each other. This is easily materialized by making them on a same integrated circuit chip.

The input signal source 10 provides an input signal, e.g., a composite video signal Sv, as described before. The composite video signal Sv is supplied to the base of the first transistor 10 of the differential circuit 12 together with a reference voltage Vref generated from the reference voltage source 32.

The sampling pulse source 28 provides a sampling pulse SP which varies periodically between the "H" or "1" level and the "L" or "0" level. In a television receiver, a burst gate pulse can be used as the sampling pulse SP, as described before. In this case, a burst gate pulse generator provided in a television receiver also is used as the sampling pulse source 28.

The sampling pulse SP controls the switch 14 so that the operation mode of the sample and hold circuit changes periodically between a sampling mode and a holding mode, as described later.

When the switch 14 turns ON in response to the "H" level input of the sampling pulse SP, the sample and hold circuit enters into the sampling mode.

Now, the sampling operation of the embodiment of the sample and hold circuit, when the base potential $Vb_1$ of the first transistor 18, i.e., the level of the composite video signal Sv biased by the reference voltage Vref is lower than the charge voltage $V_{16}$ stored in the capacitor 16 at a previous sampling operation, will be described in detail. Hereafter, the composite video signal Sv will be representative of the voltage applied to the base of the first transistor 18 for simplicity of explanation.

The first transistor 18 is turned ON with the second transistor 20 turned OFF, in response to a level difference between the levels of the composite video signal Sv and the charged voltage $V_{16}$.

Here, the first transistor 18 is coupled to the first resistor 102 of the current amplifier 100, as described before. Thus, the entirety of the constant current $Ic_1$ of the first constant current source 26 flows into the first resistor 102 of the current amplifier 100 through the first transistor 18 of the differential circuit 10. The emitter potential $Ve_3$ of the third transistor 106 then increases to the value obtained by $R_2 \cdot Ic_1$ (or $R_1 \cdot Ic_1$), so that the third transistor 106 is deactivated.

The second transistor 20 is turned OFF, as described before. The emitter potential $Ve_4$ of the fourth transistor 108 is then at the grounded potential of the grounded terminal 30. Thus, the fourth transistor 108 is activated.

The entirety of the constant current $Ic_2$ of the second current source 116 then flows into the second resistor 104 through the fourth resistor 114 and the fourth transistor 108. The base potential $Vb_4$ of the fourth transistor 108 is obtained as follows;

$$Vb_4 = R_1 \cdot Ic_2 + Vbe_4$$

wherein $Vbe_4$ is the forward base-to-emitter voltage drop of the fourth transistor 108.

The collector potential $Vc_4$ of the fourth transistor 108 lowers below the base potential $Vb_4$ by the amount of $R_4 \cdot Ic_2$. Then, the collector potential $Vc_4$ is obtained as follows;

$$\begin{aligned} Vc_4 &= Vb_4 - R_4 \cdot Ic_2 = R_1 \cdot Ic_2 + Vbe_4 - R_4 \cdot Ic_2 \\ &= Vbe_4 - 2 \cdot R_1 \cdot Ic_2 \end{aligned}$$

since $R_4 = 3 \cdot R_1$.

The collector potential $Vc_4$ of the fourth transistor 108 is applied to the base of the sixth transistor 120. Thus, the base potential $Vb_6$ of the sixth transistor 120 lowers below the base potential $Vb_4$ of the fourth transistor 108 by the amount of $R_4 \cdot Ic_2$. The decreased base potential $Vb_6$ deactivates the sixth transistor 120. As a result, the current mirror circuit 38a coupled to the sixth transistor 120 does not operate to flow any current through the seventh and eighth transistors 122 and 124.

The third transistor 106 is deactivated, as described before. Thus, the base potential $Vbe_5$ of the fifth transistor 118 is the same the base potential $Vb_3$ of the third transistor 106 so that the fifth transistor 118 is activated almost to the saturation state. As a result, a large amount of current $I_5$ flows through the fifth transistor 118.

The current $I_5$ of the fifth transistor 118 is supplied from the capacitor 16 as a discharge current from the capacitor 16 due to the charge stored in a previous sampling operation, not but from the power supply source 24 through the seventh transistor 122. This is because the current mirror circuit 38a does not flow any current, as described before. The amount of the current $I_5$ in the sampling mode will be referred as $I_5(s)$ hereafter, for convenience of explanation.

Figure 2:
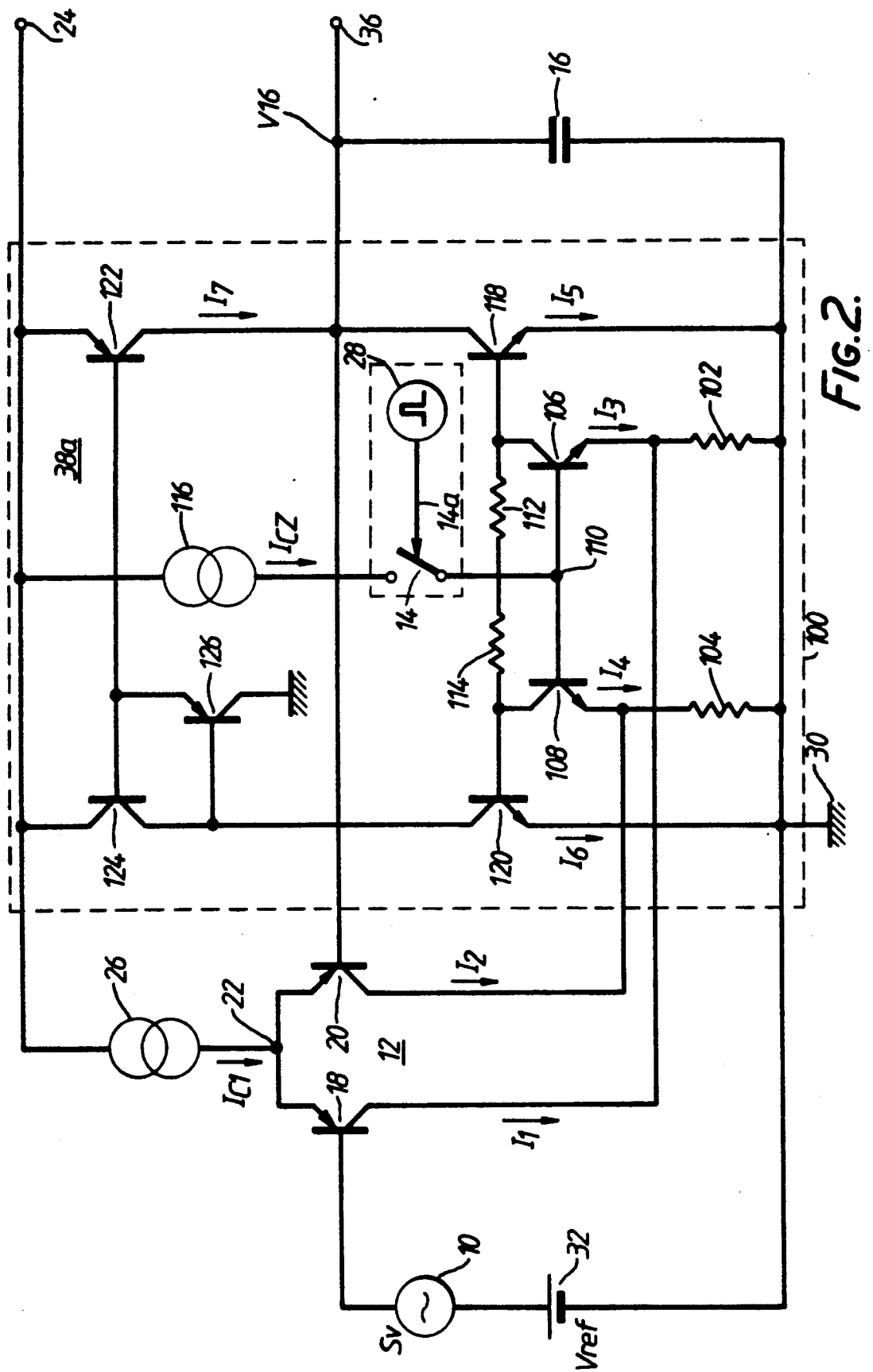
FIG. 2 is a circuit diagram showing a preferred embodiment of sample and hold circuit according to the present invention.

The current $I_5(s)$, i.e., the discharge current supplied from the capacitor 16 can be easily made equivalent to the discharge current in the conventional sample and hold circuit, as shown in FIG. 1, by a proper circuit design.

The base potential $V_{b5}$ (s) of the fifth transistor 118 in the sampling mode is higher than the base potential $V_{b5}$ (h) of the fifth transistor 118 in the holding mode, which will be described in detail later, by an amount obtained by $R_1 \cdot I_{c2}$. The increased amount $R_1 \cdot I_{c2}$ can be kept constant, although the constant current $I_{c2}$ of the second constant current source 116 is reduced. For this purpose, the resistance $R_1$ of the resistor 102, as well as the resistances $R_2$, $R_3$ and $R_4$ of the resistors 104, 112 and 114, are increased according to the aforementioned assumptions I and II. As a result, current consumption in the sampling mode of the embodiment is reduced in comparison to that of the conventional circuit.

The discharge of the capacitor 16 is finished when the charge voltage $V_{16}$ of the capacitor 16 has reached a voltage the same as the composite video signal Sv applied to the base of the first transistor 18. Thus, the sampling operation of the circuit is completed so that the composite video signal Sv on the base of the first transistor 18 is sampled as the charge voltage $V_{16}$ of the capacitor 16.

Now, the sampling operation of the embodiment of the sample and hold circuit, when the level of the composite video signal Sv is higher than the charge voltage $V_{16}$ stored in the capacitor 16 during a previous sampling operation, will be described in detail.

The first transistor 18 turns OFF, but the second transistor 20 turns ON, in response to the level difference between the levels of the composite video signal Sv and the previous charged voltage $V_{16}$.

Here, the second transistor 20 is coupled to the second resistor 104 of the current amplifier 100, as described before. Thus, the entirety of the constant current $I_{c1}$ of the first constant current source 26 flows into the second resistor 104 of the current amplifier 100 through the second transistor 20 of the differential circuit 10. The emitter potential $V_{e4}$ of the fourth transistor 108 then increases to the value obtained by $R_1 \cdot I_{c1}$, so that the fourth transistor 108 is deactivated.

The first transistor 18 is turned OFF, as described before. The emitter potential $V_{e3}$ of the third transistor 106 is then at the grounded potential of the grounded terminal 30. Thus, the third transistor 106 is activated.

The entirety of the constant current $I_{c2}$ of the second current source 116 then flows into the first resistor 102 through the third resistor 112 and the third transistor 106. The base potential $V_{b3}$ of the third transistor 106 is obtained as follows;

$$V_{b3} = R_1 \cdot I_{c2} + V_{be3}$$

wherein $V_{be3}$ is the forward base-to-emitter voltage drop of the third transistor 106.

The collector potential $V_{c3}$ of the third transistor 106 lowers below the base potential $V_{b3}$ by amount of $R_3 \cdot I_{c2}$. Then, the collector potential $V_{c3}$ is obtained as follows;

$$\begin{aligned} V_{c3} &= V_{b3} - R_3 \cdot I_{c2} = R_1 \cdot I_{c2} + V_{be3} - R_3 \cdot I_{c2} \\ &= V_{be3} - 2 \cdot R_1 \cdot I_{c2} \end{aligned}$$

since $R_3 = 3 \cdot R_1$.

The collector potential $V_{c3}$ of the third transistor 106 is applied to the base of the fifth transistor 118. Thus, the base potential $V_{b5}$ of the fifth transistor 118 lowers below the base potential $V_{b3}$ of the third transistor 106 by the amount of $R_3 \cdot I_{c2}$. The decreased base potential $V_{b5}$ deactivates the fifth transistor 118.

The fourth transistor 108 is deactivated, as described before. Thus, the base potential $V_{b6}$ of the sixth transistor 120 is the same the base potential $V_{b4}$ of the fourth transistor 108 so that the sixth transistor 120 is activated to the almost saturation state. As a result, a large amount of current $I_6$ flows through the sixth transistor 120.

The current $I_6$ of the sixth transistor 120 is supplied through the eighth transistor 124 of the current mirror circuit 38a. The current mirror circuit 38a flows a current $I_7$ the same as the current $I_6$, through the seventh transistor 122. The current $I_7$ of the seventh transistor 122 flows into the capacitor 16 not but into the fifth transistor 118, since the fifth transistor 118 is deactivated, as described before. The amount of the current $I_7$ in the sampling mode will be referred as $I_7$ (s) hereafter, for convenience of explanation.

The current $I_7$ (s) of the seventh transistor 122, i.e., the charge current supplied into the capacitor 16, can be easily made equivalent to the charge current in the conventional sample and hold circuit, as shown in FIG. 1, by a proper circuit design.

The base potential $V_{b6}$(s) of the sixth transistor 120 in the sampling mode is higher than the base potential $V_{b6}$ (h) of the sixth transistor 120 in the holding mode, which will be described in detail later, by an amount obtained by $R_1 \cdot I_{c2}$. The increased amount $R_1 \cdot I_{c2}$ can be kept constant, although the constant current $I_{c2}$ of the second constant current source 116 is reduced, as described before.

As a result, the current consumption in any states of the sampling mode of the embodiment is reduced in comparison to that of the conventional circuit.

The charge of the capacitor 16 is finished when the charge voltage $V_{16}$ of the capacitor 16 has reached a voltage the same as the composite video signal Sv applied to the base of the first transistor 18. Thus, the sampling operation of the circuit is completed so that the level of the composite video signal Sv is sampled as the charge voltage $V_{16}$ of the capacitor 16.

When the sampling operation has finished in the sampling mode, the first and second transistors 18 and 20 in the differential circuit 12 balance with each other. Thus, the constant current $I_{c1}$ of the first current source 26 flows through the first and second transistors 18 and 20 on halves, i.e., $I_{c1}/2$. The same currents $I_{c1}/2$ of the first and second transistors 18 and 20 are supplied to the first and second resistors 102 and 104. The third and fourth transistors 106 and 108 then are biased by the same emitter potentials. Thus, the operations of the third and fourth transistors 106 and 108 balance with each other.

At that time, the constant current $I_{c2}$ of the second current source 116 flows through the third and fourth transistors 106 and 108 on halves, i.e., $I_{c2}/2$. The emitter potentials $V_{e3}$ and $V_{e4}$ of the third and fourth transistors 106 and 108 are obtained as follows, from the voltage drops across the first and second resistors 102 and 104;

$$V_{e3} = V_{e4} = (I_{c1}/2 + I_{c2}/2) \cdot R_1 = (3/2) \cdot I_{c2} \cdot R_1$$

The base potentials $V_{b5}$ and $V_{b6}$ of the fifth and sixth transistors 118 and 120 are obtained as follows;

$$Vb_5 = Ve_3 + Vbe_3 - (Ic_2/2) \cdot R_3$$
$$= (3/2) \cdot Ic_2 \cdot R_1 + Vbe_3 - (Ic_2/2) \cdot 3 \cdot R_1$$
$$= Vbe_3$$

$$Vb_6 = Ve_4 + Vbe_4 - (Ic_2/2) \cdot R_4$$
$$= (3/2) \cdot Ic_2 \cdot R_1 + Vbe_4 - (Ic_2/2) \cdot 3 \cdot R_1$$
$$= Vbe_4$$

The forward base-to-emitter voltages $Vbe_3$ and $Vbe_4$ can be assumed equal when the circuit is constructed on the same integrated circuit chip. Thus, the currents $I_5$ and $I_6$ flowing through the fifth and sixth transistors 118 and 120 become the same as the currents $I_3$ and $I_4$, i.e., $Ic_2/2$ flowing through the third and fourth transistors 106 and 108.

The current $I_6$ of the sixth transistor 120 is supplied through the eighth transistor 124 of the current mirror circuit 38a. Therefore, the same current $Ic_2/2$ flows through the seventh transistor 122 of the current mirror circuit 38a.

The current amount $Ic_2/2$ of the current $I_5$ flowing through the fifth transistor 118 agrees with the current $I_7$ flowing through the seventh transistor 122. Thus, the current $I_5$ of the fifth transistor 118 is supplied from only the seventh transistor 122, not but any other circuit like the capacitor 16.

As is described above, the differential circuit 12 and the current amplifier 100 operate in the balanced states, respectively. The charge voltage $V_{16}$ of the capacitor 16 is kept to a voltage the same as the composite video signal Sv applied to the base of the transistor 18.

The current consumption in the balanced state depends on the constant current $Ic_2$ of the second constant current source 116. The amount of the current $Ic_2$ can be reduced to a small level compared to the conventional circuit, as described above.

Now, the holding operation of the embodiment of the sample and hold circuit will be described in detail.

When the switch 14 turns OFF, the sample and hold circuit enters into the holding mode. In the holding mode, the collectors and the bases of the third and fourth transistors 106 and 108 are disconnected from the second current source 116. Further, the bases of the fifth and sixth transistors 118 and 120 are disconnected from the second current source 111. Therefore, the third through sixth transistors 106, 108, 118 and 120 are deactivated. The current mirror circuit 38a also does not flow any current through the seventh and eighth transistors 122 and 124. As a result, the current amplifier 100 substantially is disconnected from the capacitor 16 in the holding mode.

The capacitor 16 is coupled to the base of the second transistor 20 of the differential circuit 12. The base current of the transistor is extremely small in any state so that the discharge of the capacitor 16 can be neglected.

As a result, the charge voltage of the capacitor 16, i.e., the composite video signal Sv sampled by the sample and hold circuit, is held unchanged in the capacitor 16 in the holding mode. In every mode, i.e., in the sampling mode and the holding mode, the embodiment of the sample and hold circuit can reduce the current consumption compared to the conventional circuit.

As described above, the present invention can provide an extremely preferable sample and hold circuit.

While there has been illustrated and described what are at present considered to be preferred embodiments of the present invention, it will be understood by those skilled in the art that various changes and modifications may be made, and equivalents may be substituted for elements thereof without departing from the true scope of the invention. In addition, many modifications may be made to adapt a particular situation or material to the teaching of the present invention without departing from the central scope thereof. Therefore, it is intended that this invention not be limited to the particular embodiment disclosed as the best mode contemplated for carrying out this invention, but that the invention include all embodiments falling within the scope of the appended claims.

What is claimed is:

1. A sample and hold circuit for sampling an input signal having a variable input voltage, comprising:
   input means for supplying the input signal;
   holding capacitor means for storing a charge voltage in response to a charge current supplied thereto when a charge voltage stored previously therein is lower than the input voltage and for producing a discharge current when the previous stored charge voltage is higher than the input voltage;
   differential circuit means having a first differential transistor and a second differential transistor for comparing the voltage levels of the input voltage and the charge voltage, and generating a differential current in response thereto;
   first constant current source connected to said differential circuit means for supplying a constant current thereto;
   current amplifier means for generating the charge current in response to the differential current when the previous stored charge voltage is lower than the input voltage and for amplifying the discharge current when the previous stored charge voltage is higher than the input voltage;
   a switch means for selectively activating and deactivating the current amplifier means; and
   wherein the current amplifier means further includes a discharge and charge control circuit for coupling a first transistor which is denominated as a first discharge transistor, to said first differential transistor and also for coupling a second transistor which is denominated as first charge transistor to said second differential transistor, and which is provided as a means for providing a means for charging and discharging said holding capacitor means, and
   a second constant current source coupled in series to the switch means for supplying said discharge and charge control circuit with a second constant current independently from said first constant current source.

2. The circuit of claim 1 wherein the differential circuit means comprises:
   means for coupling said first and second differential transistors to the input means and the holding capacitor means, respectively.

3. The circuit of claim 2 wherein the current amplifier means includes a separate discharging path and a separate charge path for discharging and charging, respectively the holding capacitor means;
   wherein said discharge path operates in response to said first transistor and said charging path is responsive to conductions by said second transistor.

4. The circuit of claim 3 wherein the discharge and charge paths are comprised of said first and second transistors for coupling the holding capacitor means to opposite ends of a potential source for supplying the sample and hold circuit with a power source.

5. The circuit of claim 4 wherein the discharge and charge control circuit further comprising a first control transistor and second control transistor coupled at their respective collector to the bases of the discharge and charge transistors, respectively.

6. The circuit of claim 5 wherein the first control transistor and the second control transistor have their respective collectors coupled to the second constant current source in common through a first resistor and a second resistor, respectively, with said first control transistor's and said second control transistor's respective bases directly coupled to the second constant current source in common and their respective emitters coupled to the potential source through a third resistor and a fourth resistor, respectively.

7. The circuit of claim 6 wherein collectors of the first and second differential transistors are coupled to the potential source through the third and fourth resistors, respectively.

8. The circuit of claim 7 wherein the charge path includes a current mirror circuit comprised of the charge transistor and a current mirror transistor coupled for generating a mirror current in the charge transistor and a coupling transistor coupled between the current mirror transistor and the second control transistor.

9. The circuit of claim 8 wherein the current mirror transistor and the second control transistor are coupled in series across the potential source.

10. The circuit of claim 9 wherein the first and second resistors have a first same resistance and the third and fourth resistors have a second same resistance.

11. The circuit of claim 10 wherein the resistance of said first resistor is M, where $M \leq 1$, times as large as the resistance of said third resistor and the constant current produced by said first constant current source is N, where $N \leq 1$, times as large as the amount of current supplied by said constant current provided by said second constant current source.

12. The circuit of claim 11 where the value of N is 3 and the value of M is 2.

* * * * *